(12) United States Patent  (10) Patent No.: US 8,177,993 B2
Seah et al.  (45) Date of Patent: May 15, 2012

(54) APPARATUS AND METHODS FOR CLEANING AND DRYING OF WAFERS

(75) Inventors: Boon Meng Seah, Singapore (SG); Bei Chao Zhang, Singapore (SG); Raymond Joy, Singapore (SG); Shao Beng Law, Singapore (SG); John Sudijono, Singapore (SG); Liang Choo Hsia, Singapore (SG)

(73) Assignee: GLOBALFOUNDRIES Singapore Pte Ltd, Singapore (SG)

( * ) Notice: Subject to any disclaimer, the term of this patent is extended or adjusted under 35 U.S.C. 154(b) by 1244 days.

(21) Appl. No.: 11/556,696

(22) Filed: Nov. 5, 2006

(65) Prior Publication Data

US 2008/0105653 A1    May 8, 2008

(51) Int. Cl.
  *B44C 1/22*  (2006.01)
(52) U.S. Cl. .............................. 216/83; 216/92; 134/1.3
(58) Field of Classification Search .................. None
  See application file for complete search history.

(56) References Cited

U.S. PATENT DOCUMENTS

| | | | |
|---|---|---|---|
| 6,096,233 A * | 8/2000 | Taniyama et al. | 216/92 |
| 6,165,314 A * | 12/2000 | Gardner et al. | 156/345.33 |
| 6,287,178 B1 | 9/2001 | Huynh | |
| 6,360,687 B1 * | 3/2002 | Yanagisawa et al. | 118/723 MW |
| 6,398,975 B1 * | 6/2002 | Mertens et al. | 216/92 |
| 6,503,837 B2 | 1/2003 | Chiou | |
| 6,637,443 B2 | 10/2003 | Huh | |
| 6,643,882 B1 | 11/2003 | Sotozaki | |
| 6,683,009 B2 * | 1/2004 | Adler et al. | 438/748 |
| 6,709,699 B2 * | 3/2004 | Ema et al. | 427/240 |
| 6,751,824 B2 | 6/2004 | Oh | |
| 6,752,877 B2 | 6/2004 | Ono | |
| 6,864,480 B2 * | 3/2005 | Staats | 506/33 |
| 7,090,328 B2 * | 8/2006 | Choi | 347/33 |
| 7,252,778 B2 * | 8/2007 | Iwamoto et al. | 216/84 |
| 7,300,598 B2 * | 11/2007 | Konishi et al. | 216/92 |
| 7,459,128 B2 * | 12/2008 | Karg et al. | 422/514 |
| 7,524,618 B2 * | 4/2009 | Ito | 430/311 |
| 2002/0003177 A1 * | 1/2002 | O'Connor et al. | 239/696 |
| 2003/0129850 A1 | 7/2003 | Olgado | |
| 2003/0228241 A1 * | 12/2003 | Legge | 422/100 |
| 2003/0230323 A1 | 12/2003 | You | |
| 2004/0020520 A1 * | 2/2004 | Kim et al. | 134/95.2 |
| 2004/0198179 A1 | 10/2004 | Gadd | |
| 2006/0049140 A1 * | 3/2006 | Mizuno et al. | 216/83 |
| 2006/0076034 A1 * | 4/2006 | Nam et al. | 134/2 |
| 2006/0174920 A1 * | 8/2006 | Randhawa | 134/34 |
| 2008/0269076 A1 * | 10/2008 | Ermakov | 506/32 |
| 2008/0314870 A1 * | 12/2008 | Inoue et al. | 216/38 |

FOREIGN PATENT DOCUMENTS

JP        04048085 A    *  2/1992

* cited by examiner

*Primary Examiner* — Anita Alanko

(74) *Attorney, Agent, or Firm* — Horizon IP Pte Ltd

(57) ABSTRACT

An first example method and apparatus for etching and cleaning a substrate comprises device with a first manifold and a second manifold. The first manifold has a plurality of nozzles for dispensing chemicals onto the substrate. The second manifold is attached to a vacuum source and/or a dry air/gas source. A second example embodiment is a wafer cleaning device and method that uses a manifold with capillary jet nozzles and a liquid capillary jet stream to clean substrates.

14 Claims, 4 Drawing Sheets

APPARATUS AND METHODS FOR CLEANING AND DRYING OF WAFERS

BACKGROUND OF INVENTION

1) Field of the Invention

This invention relates generally to devices and methods for etching and cleaning semiconductor structures and more particularly to apparatuses and methods for etching and cleaning semiconductor structures, such as wafers.

2) Description of the Prior Art

Current practice use tremendous amount of chemicals & water for wet etching & cleaning of wafers. It is desirable to develop methods and tools to reduce chemical and water usage while improving the etching and cleaning of wafer.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,751,824 B2—Oh et al.
U.S. Pat. No. 6,287,178—Huynh et al.—Wafer carrier rinsing mechanism.
US20030129850A1: System for planarizing metal conductive layers.
U.S. Pat. No. 6,752,877: Ono, Yuji—Single wafer type cleaning method and apparatus.
US20030230323A1—You et al.—Apparatus and method for improving scrubber cleaning.
U.S. Pat. No. 6,637,443:—Huh,—Semiconductor wafer cleaning apparatus and method.
US20040198179A1: Gadd—Abrasive fluid jet system.
U.S. Pat. No. 6,643,882: Sotozaki et al.—Substrate cleaning apparatus.
U.S. Pat. No. 6,503,837:—Chiou—Method of rinsing residual etching reactants/products on a semiconductor wafer.

SUMMARY OF THE INVENTION

Some non-limiting example embodiments of the present invention provide a structure and a method of cleaning and/or etching a substrate which may be characterized as follows.

In a first embodiment, of an apparatus for etching and/or cleaning a substrate comprises:
  a first manifold and a second manifold; the first manifold and the second manifold are spaced apart;
  a liquid source for supplying a liquid to the first manifold;
  the first manifold provided with a first bottom; the first bottom of the first manifold provided with a plurality of spaced first nozzles adapted to pass liquid through;
  a gas pressure source for supplying gas to the second manifold; the second manifold provided with a second bottom; the second bottom of the second manifold provided with a plurality of spaced second nozzles adapted to pass gasses through;
  the gas pressure source adapted to supply either negative pressure or positive pressure gas to the second nozzles.

An aspect of the first embodiment, is a method of etching and cleaning substrate comprising the steps of:
  providing the cleaning apparatus of the first embodiment;
  in a first pass, passing the first manifold and second manifold over the substrate from a first end to a second end and flowing chemicals though the first manifold and the first nozzles over the substrate; and removing the chemicals from the substrate by a vacuum or blowing gas through second nozzles in the second manifold;
  in a back up step, passing the first and second blades back over the substrate from a second end to the first end;
  in a second pass step; passing the first and second blades over the substrate from a first end to a second end; and flowing a liquid through the first nozzles in the first manifold over the substrate; and removing the water from the substrate by a vacuum or blowing gasses through the second nozzles in the second manifold.

A second example embodiment comprises an apparatus having capillary jet nozzles for cleaning a substrate that comprises:
  a substrate chuck for supporting a substrate;
  a manifold having a passageway in communication with spaced apart nozzles;
  a liquid source supplying a liquid to the manifold;
  a means for moving the manifold relative to the substrate chuck.

An aspect of the second embodiment, further comprises:
  an supporting arm connected to the manifold; the supporting arm having an arm passageway connected to a central passageway in the manifold in communication with the capillary jet nozzles.

An aspect of the second embodiment, further comprises: the nozzles are comprised of capillary jet nozzles.

An aspect of the second embodiment, further comprises: the nozzles are capillary jet nozzles having an opening with a diameter smaller than or about equal to 0.1 micron.

An aspect of the second embodiment is a method of cleaning a substrate comprising the steps of:
  providing the cleaning apparatus of the second embodiment; then
  rotating a substrate upon the substrate chuck;
  directing a stream of liquid from the capillary jet nozzles onto the surface of the substrate;
  moving manifold across the entire substrate.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of an apparatus and method according to example embodiments of the present invention and further details in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

Below are descriptions of non-limiting example embodiments. The example embodiments do not limit the inventions defined by the claims.

I. Example Embodiment 1

Double Manifold Apparatus for Etch and/or Clean Drying

A. Overview of Apparatus

The first example embodiment comprises a double manifold tool that may have a first manifold to etch/clean substrates and a second manifold to dry wafers.

Figure 1A:
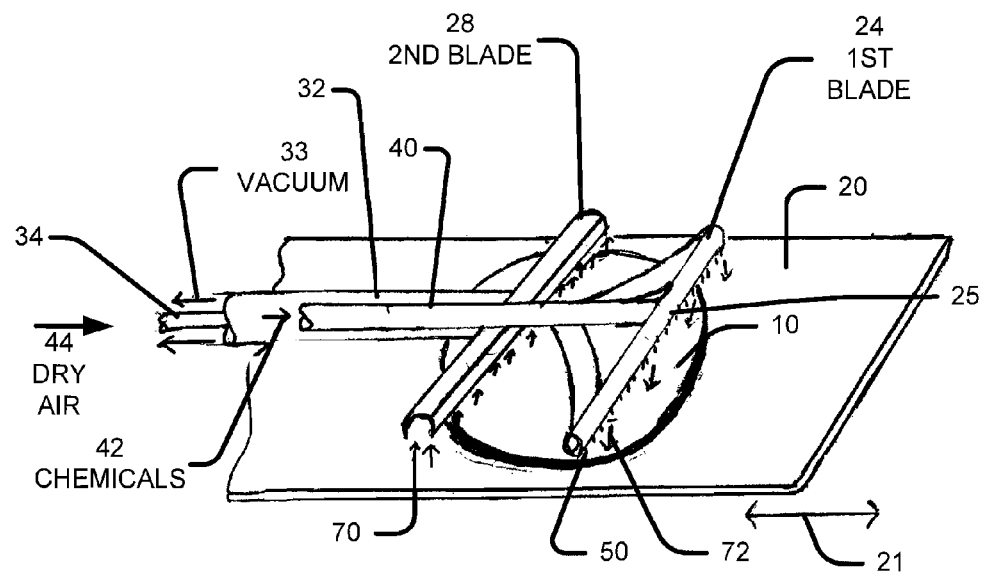
FIG. 1A is a perspective view illustrating a device and method for etching, cleaning and drying a substrate according to a first example embodiment of the present invention.

FIG. 1A shows an apparatus for etching and cleaning a substrate 10. The apparatus comprises a transporting means 20 for moving a substrate 10 under a first manifold (blade) 24 and a second manifold (blade) 28. The transporting means 20 can be a wafer transporter, belt or track, or other suitable device.

The first manifold 24 (also called a blade) is attached to or connected to a first tubular shaft 40 or arm 40. The second manifold 28 can be connected to a second shaft 32 or arm 32. The first and second shafts can be connected to each other or can be merged into a common shaft behind the blades.

The substrate 10 can be a semiconductor substrate or wafer or any suitable structure at any stage of fabrication. This example embodiment is applicable to all stages of the process where cleaning or removal of particles/residues is required. The substrate (e.g., or wafer) can have overlaying layers such as insulating and conductive layers.

B. First Manifold

The bottom of the first manifold 24 (facing the substrate) preferably has a plurality of nozzles for dispensing chemicals onto the substrate.

The first manifold 24 can be attached to a first tubular shaft 40 that is connected to a chemical source 42. The first manifold (blade) 24 preferably has a width at least as wide as the substrate 10.

The first manifold 24 preferably has an elongated shape and has a plurality of spaced nozzles 50 on its underside. The manifold can have an elongated tubular shape. The manifold can have a length at least 4 or 6 or 8 times it's width.

FIG. 1A shows arrows 72 that may represent liquid and/or air flow down onto the substrate 10. FIG. 1A shows upward arrows 70 that may represent liquid and/or air flow up into the second blade 28.

Figure 1B:
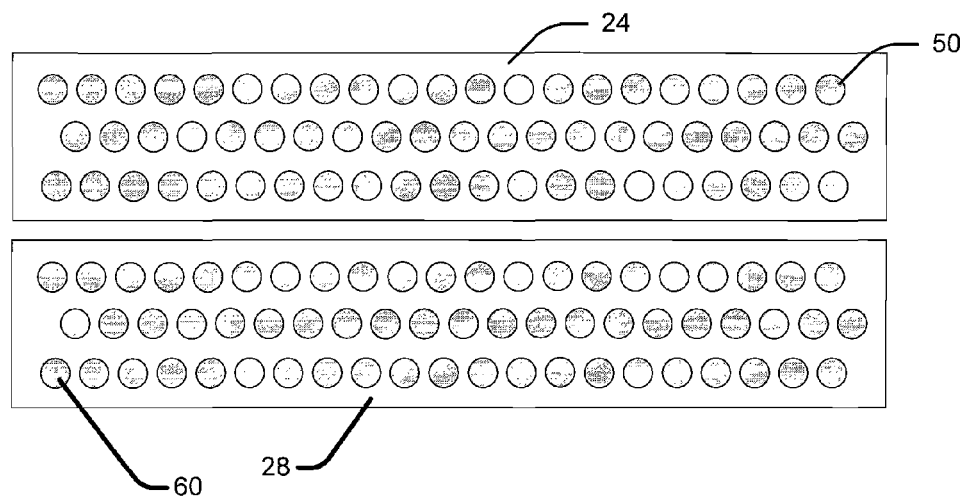
FIG. 1B is a plan view of the bottom of the first and second manifolds according to a first example embodiment of the present invention.

FIG. 1B shows a bottom-up view of the bottom of the first manifold 24 and second manifold 28. The first manifold 24 has a plurality of first liquid nozzles 50. The nozzles are connected to channels or tubes that connect to or communicate with the chemical supply 42 (FIG. 1A). Note, FIG. 1B does not show the spacing between the manifolds to scale.

The number of nozzles, rows and configuration can be optimized to improve the cleaning. The nozzles in the first and second manifolds can be comprised of capillary jet nozzles or capillary tubes. The capillary jet nozzles can have an opening diameter of about 0.1 micron or less.

C. Second Manifold

The second manifold 28 is preferably used to blow dry or vacuum dry the substrate.

The second manifold (blade) 28 can be attached to a vacuum source 33 (negative pressure) or to a dry air source 44 (positive pressure).

The second blade can use suction (vacuum) or blown gas or both (a combination of) blown gas and suction to remove the liquid from the wafer. The second blade can be used to blow away the liquid that adheres to the surface with either heated nitrogen or Ar supplemented with IPA vapor for improving the efficiency of drying.

In an aspect of the process, simultaneously some of the nozzles can be blowing a gas onto the substrate and some of the nozzles can be sucking gas and liquid off the substrate.

FIG. 1B shows a view of the bottom of the drying blade 28. The drying blade can push away liquid from the surface of the substrate by using air/gas (N2/Ar) jet streams that pass through the second drying nozzles 60. In addition to the gases, a small amount of IPA vapor can be used. The nozzles in the first and second manifolds can be capillary jet (CJ) nozzles or capillary tubes. The CJ nozzles preferably have an opening with a size (i.e., diameter) less than or about equal to 0.1 micron.

When using the suction effect, the position of drying blade 28 is preferably kept close to the boundary layer of the liquid. With the application of suction, liquid will be drawn away from substrate surface.

The second manifold 28 can be connected to a second (double) tubular shaft 34 32 that can be connected to the vacuum source 33. The double tubular shaft is preferably comprised of an outer tube 32 and an inner tube 34. Other configurations are possible as the second tubular shaft can be made in other configurations such as the tube 32 being along side tube 34.

The first and second arms 40 and 32 34 can be connected to keep the manifolds 24 28 spaced apart. Other supports for the first and second arms are possible.

The second manifold (blade) preferably has a width at least as wide as the substrate 10.

D. Configuration of $1^{st}$ and $2^{nd}$ Manifolds

The first manifold (blade) 24 and the second manifold (blade) 28 are preferably spaced and preferably approximately parallel. The first and the second manifold (blades) are spaced from and approximately parallel to the transporting means 20.

The first and the second manifold (blade) are spaced from and approximately parallel to direction 21 of substrate travel on the track or transporting means 20.

The first manifold (blade) 24 and the second manifold (blade) 28 are spaced from each other a first distance.

The first shaft 40 and the second shaft 32/34 can be can be connected to each other.

E. Liquid Source

The liquid (e.g., chemical) source 42 is adapted to contain and handle chemicals comprising $H_2O$, DHF, SC1 (H2O+

NH4OH+H2O2), and SC2 (H2O+HCl+H2O$_2$), or any other chemicals used for etching and/or cleaning. The liquid source can supply more than one liquid and can supply different liquids at different times (or passes).

F. Sensor

A sensor 25 can be used to determine the position of the semiconductor structure 10.

The sensor can be an optical or proximity type of sensor. The purpose is to detect the location of the wafer that will be placed correctly on the chuck or track 20.

The sensor can be mounted or located near or on the manifold or under the manifold. The sensor can be used to position the wafer and to prevent the blades from hitting the wafers.

FIG. 1A shows an example schematic representation of a sensor 25 in an example position on the 1$^{st}$ blade 24.

II. First Example Method Embodiment

Process Using the Double Manifold Wafer Cleaning Device

In a first example method embodiment, the 1$^{st}$ example device embodiment is used in a method to clean and dry substrates.

The example method can be described as follows.

A. First Pass/Step—Clean/Etch Step

In a first pass, we pass the first manifold (blade) 24 and second manifold (blade) 28 (nozzle tube devices) over the substrate 10 from a first end to a second end of the substrate 10. We flow liquids (e.g., chemicals) thru the first manifold (blade) 24 and first liquid nozzles 50 onto the substrate 10. As the second manifold passes over the substrate, the second manifold removes the chemicals and other contaminants from the substrate with a vacuum through the second manifold (blade) 28 and second drying nozzles 60. Preferably both the first and second blades pass over the entire substrate surface.

In the first (forward) pass/step (and all other passes or steps), either the substrate moves and the blades are stationary, or the manifolds are stationary and the substrate moves. The wafer can be moved on the transportation means 20. Alternatively, both the substrate and the manifolds can move. When we state that the manifold moves relative to the wafer or wafer transporter, it is understood that either the manifold or the wafer/wafer transporter moves or both.

B. Optional Back-Up Step

In an optional (back-up) step, we pass the first and second blades 24 28 over the substrate from the second end to the first end of the substrate 10.

C. Second Pass/Step—Rinse/Dry Step

In a second (forward) pass step, we pass the first and second blades 24 28 over the substrate from a first end to a second end. We flow second liquid (e.g., water) from the liquid source through the first manifold (blade) 24 and first liquid nozzles 50 onto the substrate 10. We remove the liquid (expelled by the first nozzles) from the substrate by using a vacuum or a gas blown through the second manifold (blade) 28 and second nozzles 60.

III. Second Example Embodiment

Apparatus—CJ Wafer Scrubbing

The second example device embodiment is a wafer cleaning tool that has a first wafer scrubber manifold with capillary jet nozzles on the bottom.

Figure 2A:
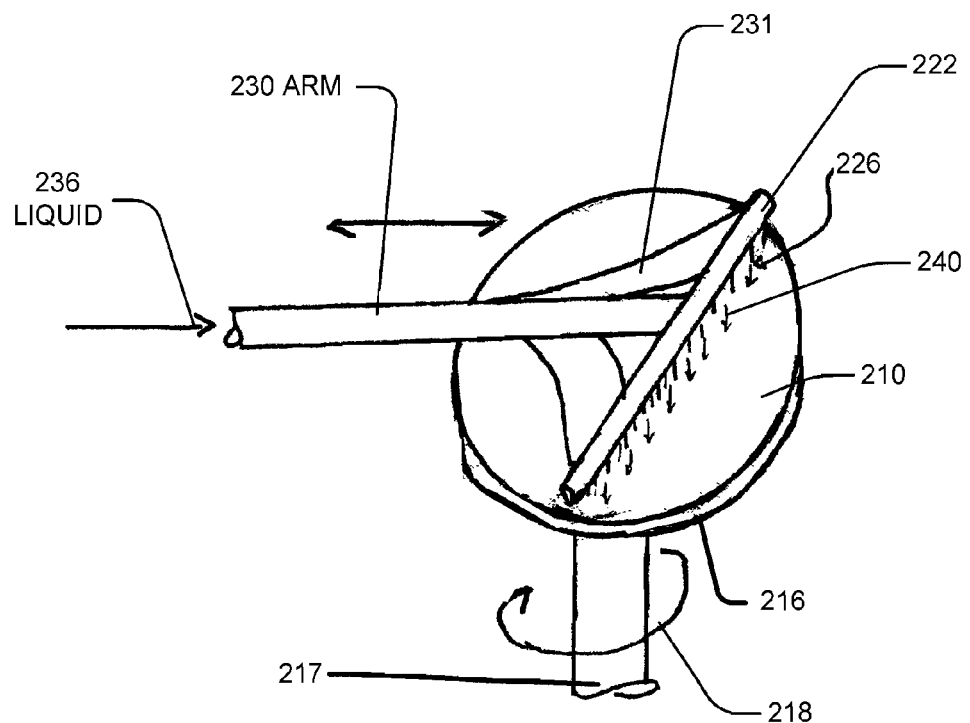
FIG. 2A is a perspective view illustrating a device and method for cleaning a substrate according to an second example embodiment of the present invention.

FIG. 2A shows an apparatus for cleaning a substrate 210. The substrate chuck 216 supports a substrate 210. A rotation means 218 rotates the substrate 210.

The rotation means can comprise the following. A substrate chuck 216 can be vacuum activated and is mounted on a rotatable spindle 217. The spindle 217 can be operatively connected to an electric motor. A speed controller is operatively connected to the motor for rotating the spindle at a selected variable speed.

A. Wafer Scrubber Manifold has CJ Nozzles

A tubular 222 or circular 223 manifold (blade) preferably has a central passageway(s) in communication with spaced-apart capillary jet (CJ) nozzles 226 on the bottom of the blade 222. The manifold/blade can be placed just above the wafer/substrate.

B. Capillary Jet Nozzles

Figure 2B:
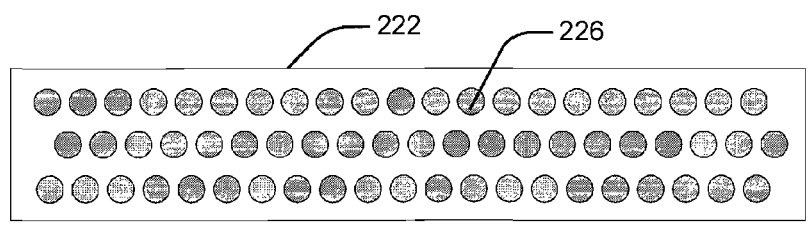
FIG. 2B is a plan view of the bottom of the elongated manifold according to a second example embodiment of the present invention.

FIG. 2B shows a view of the bottom of the CJ nozzles 226 in the wafer scrubber manifold 222.

FIG. 2B shows a blade type manifold design.

Figure 2C:
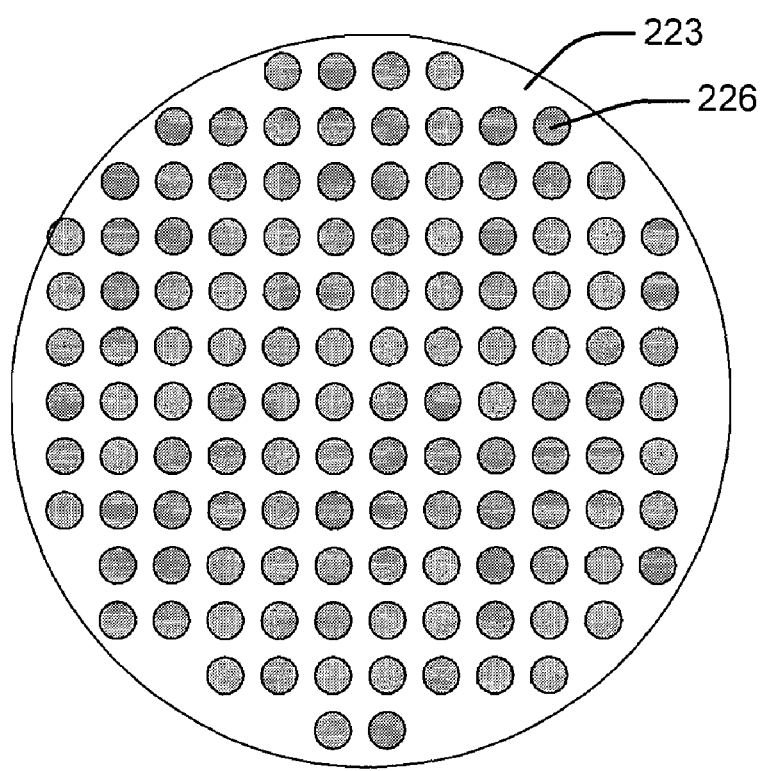
FIG. 2C is a plan view of the bottom of the about circular manifold according to an aspect of a second example embodiment of the present invention.
Figure 2D:
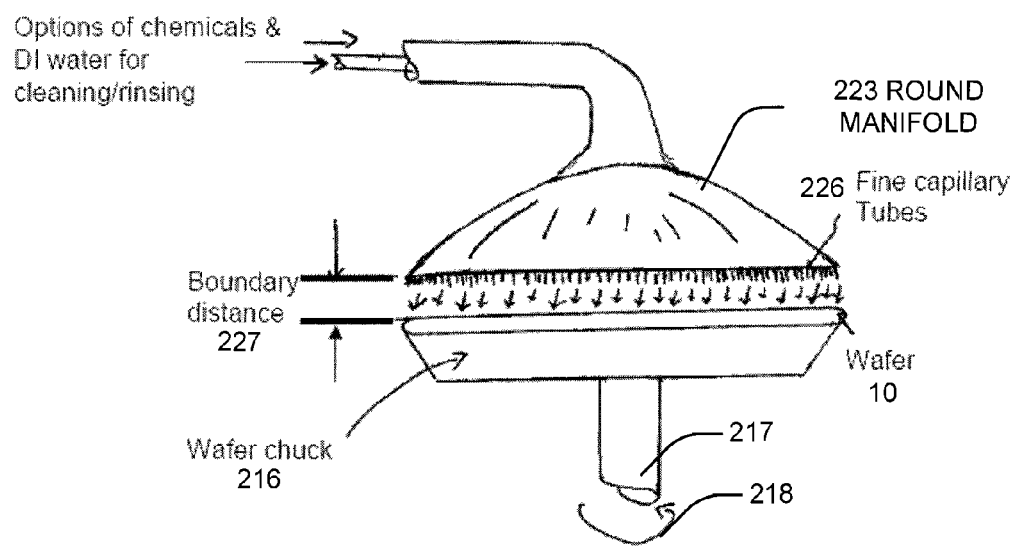
FIG. 2D is a side view of an about circular manifold according to an aspect of the second example embodiment of the present invention.

FIG. 2D shows a side view of a round type manifold 223. FIG. 2D is a side view of the circular manifold 223 shown in FIG. 2C. FIG. 2D shows the boundary distance 227.

FIG. 2C shows a bottom view of a round type manifold 223 design. This round or circular manifold/blade 223 can be placed just above the wafer/substrate.

Very dense capillary jet (CJ) nozzles 226 on the bottom of the shower head (manifold) 222 are spaced as densely as possible to cover the entire bottom surface or at least the area corresponding to the substrate to be cleaned.

The CJ nozzles preferably have an opening with a size less than 0.1 micron or about equal to 0.1 micron. The idea is that the jet coming out of a 0.1 micron opening is small/"sharp" enough to dislodge similar sized particles on each area of the surface of the substrate.

The pressure of the liquid should be strong enough to dislodge particle/residues.

The (manifold) shower head 222 223 is preferably kept as close as possible to the wafer (close to the boundary layer) for maximum effect.

The tubular capillary jet device 222 is configured to orient the capillary nozzles to direct the jet stream of liquid to the surface of the substrate at an angle of incidence with respect to the surface of the wafer of not more than about 10 degrees.

The capillary jet nozzles preferably point in an approximately vertical direction (within +/−10 degrees of vertical) to the surface of the substrate.

There are preferably at least 1 or more rows of CJ nozzles 226. The nozzles can also have other orientations. The exact number or row and nozzles should be optimized for the particular process.

For the round (circular or cylindrical) manifold in FIG. 2C, the round manifold 223 should be slightly bigger (for better coverage) than the wafer 10 size when it is placed directly over the wafer surface. The round manifold has a bottom shape that can be slightly larger than the wafer to be cleaned. The round manifold has a bottom shape that can completely cover the wafer to be cleaned.

C. Arm

An arm is connected (directly or indirectly) to or attached to the tubular manifold. Indirectly connected means that another object(s) can be connected to the manifold and to the arm. For example, referring to FIG. 2A, arm 230 is connected to or attached to the tubular manifold 222. The retractable arm 230 preferably has a center passageway connected to a center passageway in the tubular capillary jet device 222 connected to the capillary jet nozzles 226. The retractable arm 230 can be attached to a retracting means to move the retractable arm back and forth. The retracting means can be a mechanical assembly.

The arm can have arm supports 231.

In operation the manifold can be moved back and forth across the wafer or the wafer is moved relative to the manifold.

D. Liquid Source

The liquid source 236 is connected to the manifold. The liquid source can supply water or a chemical and, most preferably, supplies water.

The liquid source 236 and the capillary jet nozzles are adapted to inject the water jet steam.

A liquid (e.g., water) source 236 is connected to a retractable arm 230 that communicates with the capillary jet nozzles to produce a jet stream of liquid 240.

A retraction means can move the manifold 222 over the substrate in a linear direction.

E. Retraction Means

The retraction means that moves the manifold to pass over the wafer can be comprised of a motor mechanism. The retraction means can be connected to the arm 230.

IV. $2^{nd}$ Example Method Embodiment

In a second example method embodiment, the 2nd example device embodiment (FIGS. 2A, 2B, 2C and 2D) is used in a method to clean and dry substrates.

The example method can be described as follows.

We provide the equipment described above for the second device embodiment.

A. Rotate the Substrate Upon the Substrate Chuck

We rotate the substrate 210 upon the substrate chuck 216.

B. Direct a Stream of Liquid from the Capillary Jet Nozzles onto the Surface of the Substrate We direct a stream of liquid 240 from the capillary jet nozzles 226 onto the surface of the substrate 210. Water or a liquid from the liquid source 236 passes through the arm 230, manifold 222 and CJ nozzles 226 onto the substrate.

C. Manifold Across the Entire Substrate

We move the retractable arm 230 and tubular capillary jet device 222 across the entire substrate 210 in a first direction and back in an opposite direction.

The stream of fluid 240 from the capillary jet nozzles 226 has a pressure on the substrate surface. The stream cleans the surface of the substrate.

The method can also comprise withdrawing the manifold so the manifold is not over the substrate. Then we can spin the substrate using the substrate chuck to dry the substrate.

D. Non-Limiting Example Embodiments

Given the variety of embodiments of the present invention just described, the above description and illustrations should not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims, therefore, should be accorded the broadest interpretation so as to encompass all such modifications and similar arrangements and procedures.

What is claimed is:

1. A method of manufacturing a device comprising:
   providing a cleaning apparatus comprising
      a first manifold and a second manifold; said first manifold and said second manifold are spaced apart,
      a liquid source for supplying a liquid to said first manifold,
      said first manifold provided with a first bottom, wherein said first bottom of said first manifold is provided with a plurality of spaced first capillary jet nozzles or capillary tubes through which said liquid passes onto a substrate,
      a gas source for supplying gases to said second manifold, wherein said second manifold is provided with a second bottom; the second bottom of said second manifold provided with a plurality of spaced second capillary jet nozzles or capillary tubes through which said gases pass onto the substrate, and
      the gas source adapted to supply either negative pressure or positive pressure gases to said second capillary jet nozzles or capillary tubes;
   in a first pass, moving the first manifold and second manifold over an entire top surface of the substrate while dispensing said same liquid through said first manifold and said first capillary jet nozzles or capillary tubes over the entire top surface of said substrate; and
   removing at least some said liquid from said substrate by a vacuum or blowing gas passing through said second capillary jet nozzles or capillary tubes in said second manifold.

2. The method of claim 1 which further comprises:
   in a second pass step, moving the first manifold and second manifold over the entire top surface of the substrate while flowing a liquid through said first capillary jet nozzles or capillary tubes in said first manifold over said substrate; and
   removing said liquid from said substrate by a vacuum or blowing gasses through said second capillary jet nozzles or capillary tubes in said second manifold.

3. The method of claim 1 wherein the first capillary jet nozzles or capillary tubes and the second capillary jet nozzles or capillary tubes have an opening with a size diameter less than or equal to about 0.1 micron.

4. The method of claim 1 wherein in the first pass step, either the substrate moves and the first and second manifolds are stationary or the substrate is stationary and the first and second manifolds move.

5. The method of claim 1 wherein said liquid source is adapted to supply chemicals comprising at least one of $H_2O$, DHF, SC1 or SC2, or a combination thereof.

6. A method of manufacturing a device comprising:
   providing a cleaning apparatus having spaced apart capillary jet nozzles or capillary tubes comprising
      a rotatable substrate chuck,
      a manifold having a central passageway in communication with said capillary jets nozzles or capillary tubes,
      an arm connected to said manifold,
      a liquid source that supplies a liquid to said manifold, and
      a retraction mechanism for moving said manifold over said substrate;
   providing a substrate on the substrate chuck;
   rotating the substrate upon said substrate chuck;
   directing a stream of said liquid from said capillary jet nozzles or capillary tubes onto an entire top surface of said substrate; and moving the manifold across the entire substrate, wherein the capillary jet nozzles or capillary tubes have openings with a diameter of less than or equal to about 0.1 micron.

7. The method of claim 6 wherein the capillary jets nozzles or capillary tubes project a liquid capillary jet stream onto the substrate.

8. The method of claim 6 wherein said manifold has an elongated shape or an about round shape.

9. The method of claim 6 which further includes moving said retractable arm and moving said manifold across the entire substrate in a first direction and back in an opposite direction.

10. The method of claim 6 which further comprises:
withdrawing said manifold so said manifold is not over said substrate; and
spinning said substrate using said substrate chuck to dry said substrate.

11. The method of claim 1 wherein the substrate after cleaning is further processed to form the device.

12. The method of claim 6 wherein the substrate after cleaning is further processed to form the device.

13. A method of cleaning a substrate comprising:
providing a first manifold connected to a liquid source for supplying the same liquid onto an entire top surface of a substrate to clean the substrate; and
providing a second manifold spaced apart from said first manifold, said second manifold connected to a gas source for supplying gases to said second manifold to remove the liquid from the top surface of the substrate by a vacuum or blowing gas, wherein said first manifold is provided with a first bottom having a plurality of spaced first nozzles through which said liquid passes onto the substrate and wherein said second manifold is provided with a second bottom having a plurality of spaced second nozzles through which said gases pass onto the substrate, wherein simultaneously some of the second nozzles are blowing a gas onto the substrate and some of the second nozzles are sucking gas and liquid off the substrate.

14. The method of claim 13 wherein said nozzles comprises capillary jet nozzles or capillary tubes.

* * * * *